(12) United States Patent
Solmaz et al.

(10) Patent No.: US 12,716,131 B2
(45) Date of Patent: Aug. 25, 2026

(54) DEPOSITION METHODS USING PULSED PLASMA WITH VARYING PULSE FREQUENCY

(71) Applicant: Tokyo Electron Limited, Tokyo (JP)

(72) Inventors: Evrim Solmaz, Austin, TX (US); Melvin Verbaas, Austin, TX (US); Jianping Zhao, Austin, TX (US); Barton Lane, Austin, TX (US); Du Zhang, Albany, NY (US); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

(21) Appl. No.: 18/957,207

(22) Filed: Nov. 22, 2024

(65) Prior Publication Data

US 2026/0146322 A1 May 28, 2026

(51) Int. Cl.
*C23C 16/455* (2006.01)
*C23C 16/44* (2006.01)
*C23C 16/505* (2006.01)

(52) U.S. Cl.
CPC .... *C23C 16/45542* (2013.01); *C23C 16/4408* (2013.01); *C23C 16/45553* (2013.01); *C23C 16/505* (2013.01)

(58) Field of Classification Search
CPC .......... C23C 16/45542; C23C 16/4408; C23C 16/45553; C23C 16/505
See application file for complete search history.

(56) References Cited

U.S. PATENT DOCUMENTS 9,076,646 B2 7/2015 Sims
10,435,790 B2 10/2019 Fukazawa
10,784,092 B2 9/2020 Weichart
11,398,369 B2 * 7/2022 Wang .................. H01J 37/3244
(Continued)

FOREIGN PATENT DOCUMENTS

CN 117637594 * 3/2024 ........... H01L 21/762
KR 10-2013-0027935 * 3/2012 ............... H05H 1/46
KR 10-2022-0065978 * 5/2022 ............ H01L 21/311

OTHER PUBLICATIONS

You Jin Ji, et al., "Plasma enhanced atomic layer deposition of silicon nitride using magnetized very high frequency plasma". Nanotechnology 35 (2024) 275701, pp. 1-11.*
(Continued)

*Primary Examiner* — Bret P Chen
(74) *Attorney, Agent, or Firm* — Slater Matsil, LLP

(57) ABSTRACT

A method for a cyclic deposition process includes loading a substrate into a plasma processing chamber; generating source power pulses having a pulse frequency that varies from a first frequency to a different second frequency; and performing the cyclic deposition process to deposit a plurality of layers. One cycle of the cyclic deposition process deposits one layer of the plurality of layers and includes flowing a process gas into the plasma processing chamber; powering a source electrode of the plasma processing chamber with the source power pulses to generate a plasma; and, while varying the pulse frequency applied to the source electrode from the first frequency to the second frequency, exposing the substrate to the plasma to deposit one layer of the plurality of layers onto the substrate.

20 Claims, 9 Drawing Sheets

(56) References Cited

U.S. PATENT DOCUMENTS

| | | | | |
|---|---|---|---|---|
| 11,631,583 | B2 | 4/2023 | Moghadam | |
| 2014/0113457 | A1* | 4/2014 | Sims | H10P 14/69433 438/778 |
| 2014/0183033 | A1* | 7/2014 | Spitzl | B01D 53/32 204/157.43 |
| 2015/0000841 | A1* | 1/2015 | Yamada | H05H 1/46 156/345.28 |
| 2015/0206716 | A1* | 7/2015 | Kim | H01J 37/32183 118/723 R |
| 2020/0075293 | A1* | 3/2020 | Ventzek | H01J 37/32082 |
| 2020/0216959 | A1 | 7/2020 | Mukherjee | |
| 2021/0407771 | A1* | 12/2021 | Funk | H01J 37/3299 |
| 2022/0367149 | A1* | 11/2022 | Funk | H01L 22/20 |
| 2022/0392749 | A1* | 12/2022 | Ventzek | H01J 37/32146 |
| 2023/0143204 | A1 | 5/2023 | Iwao | |
| 2023/0340661 | A1* | 10/2023 | Cheng | H01J 37/32082 |
| 2023/0377892 | A1* | 11/2023 | Wan | H01J 37/32357 |
| 2024/0145215 | A1* | 5/2024 | Dash | H01J 37/32091 |
| 2025/0166972 | A1* | 5/2025 | Solmaz | H01J 37/3244 |

OTHER PUBLICATIONS

Oh, Il-Kwon, et al., “Very high frequency plasma reactant for atomic layer deposition”. Applied Surface Science, vol. 387, Nov. 30, 2016, pp. 109-117.*

Oke, James A., et al., “Atomic layer deposition and other thin film deposition techniques: from principles to film properties”. Journal of Materials Research and Technology 2022, 21, 2481-2514.*

Van de Poll, Mike L., et al., “Excellent conformality of atmospheric-pressure plasma-enhanced spatial atomic layer deposition with subsecond plasma exposure times”. Appl. Phys. Lett. 123, 182902 (2023), pp. 1-5.*

Ovanesyan, Rafaiel A. et al., “Low-Temperature Conformal Atomic Layer Deposition of SiNx Films Using Si2Cl6 and NH3 Plasma,” ACS Publications, ACS Appl. Mater. Interfaces 2015, 7, Published Apr. 30, 2015, 10806-10813.

Wikipedia, “CHIRP” “https://en.wikipedia.org/w/index.php?title=Chirp&oldid=1230749142”, retrieved on Oct. 22, 2024, 9 pages.

Solmza et al., U.S. Appl. No. 18/517,206, filed Nov. 22, 2023.

* cited by examiner

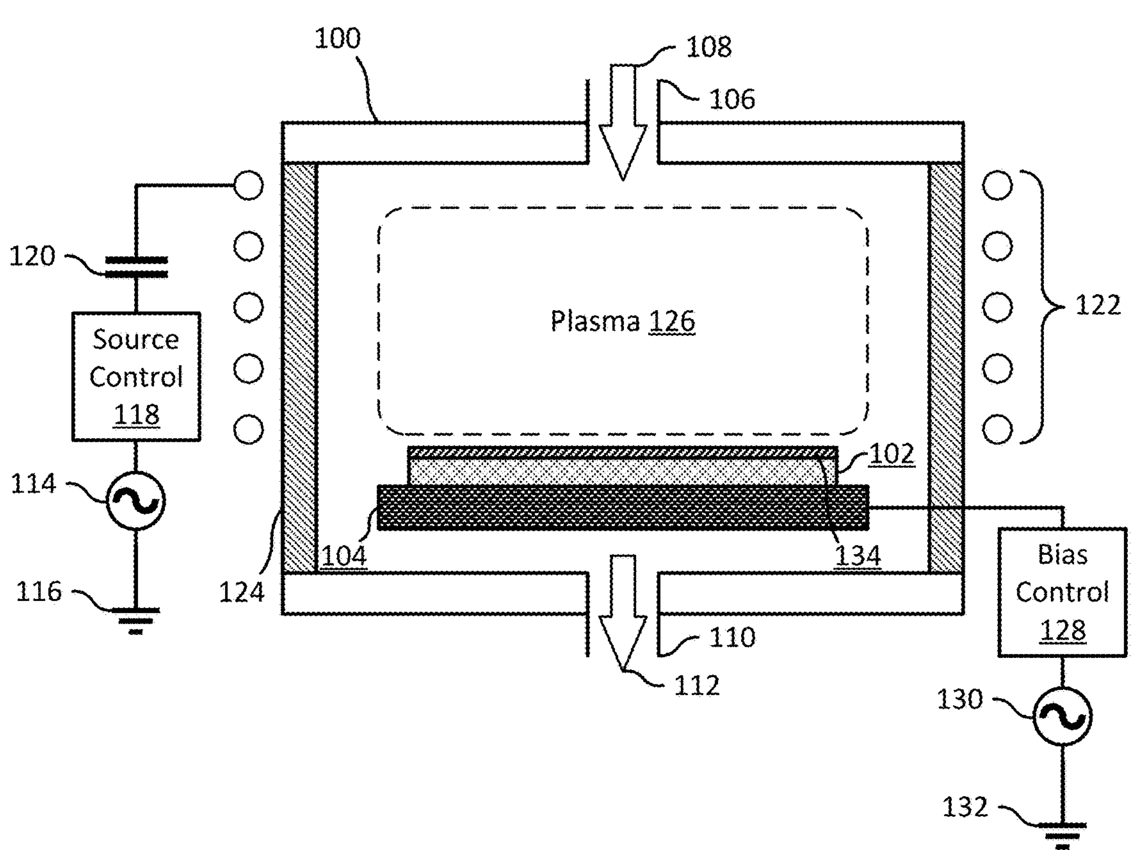
Figure 1
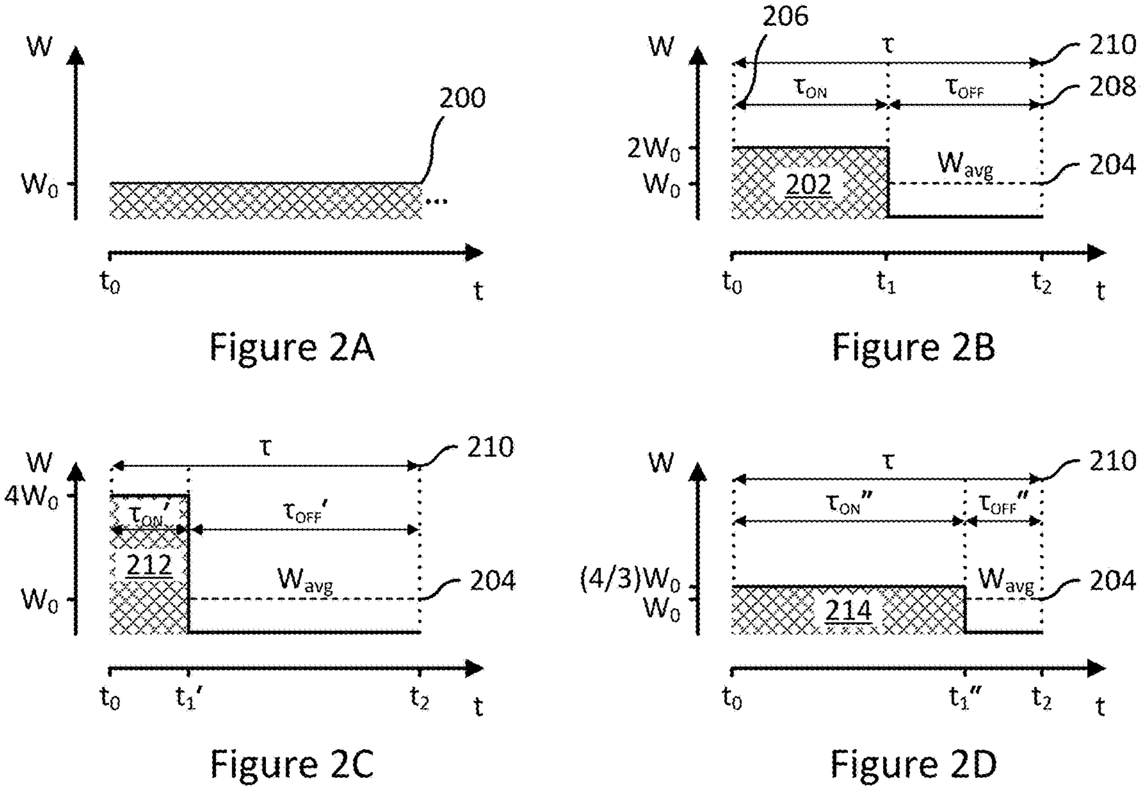
Figure 2A
Figure 2B
Figure 2C
Figure 2D

DEPOSITION METHODS USING PULSED PLASMA WITH VARYING PULSE FREQUENCY

TECHNICAL FIELD

The present invention relates generally to plasma processing, and in particular embodiments, to plasma processing methods, apparatus, and systems.

BACKGROUND

Semiconductor devices are conventionally fabricated over a prepared substrate by process flows comprising a large number and variety of steps, such as ion implantation, material deposition, patterning, etching, planarization, and so on. A given process flow produces a network of electronic components (such as transistors, resistors, and capacitors) and interconnect elements (such as metal lines, contacts, and vias) with characteristics determined by the materials chosen to form them. In turn, the connectivity of the component network forms the resulting device (such as an integrated circuit) and determines its function.

Many individual steps in a semiconductor process flow may be performed using plasma processes. In particular, various plasma deposition and plasma etching processes are in conventional use. The requisite plasma may be generated by applying source power to an electrode, with the resulting electric field coupling to and ionizing a gas (or gas mixture) within a plasma processing chamber. Various parameters of a plasma process and conditions within the plasma processing chamber may determine whether material is deposited onto or etched from the substrate. The rate of deposition or etching may also be affected, with corresponding implications for throughput of finished devices and thus for the economic viability of a given process flow.

SUMMARY

In an embodiment, a method for a cyclic deposition process includes loading a substrate into a plasma processing chamber; generating source power pulses having a pulse frequency that varies from a first frequency to a different second frequency; and performing the cyclic deposition process to deposit a plurality of layers. One cycle of the cyclic deposition process deposits one layer of the plurality of layers and includes flowing a process gas into the plasma processing chamber; powering a source electrode of the plasma processing chamber with the source power pulses to generate a plasma; and, while varying the pulse frequency applied to the source electrode from the first frequency to the second frequency, exposing the substrate to the plasma to deposit one layer of the plurality of layers onto the substrate.

In another embodiment, a method for processing a substrate includes loading a substrate into a process chamber; performing a first deposition process that includes flowing a first process gas into the process chamber and exposing the substrate to the first process gas to deposit a first layer; performing a second deposition process that includes flowing a second process gas into the process chamber, powering a source electrode of the process chamber with source power pulses to generate a plasma, the source power pulses having a repetition frequency, and exposing the substrate to the plasma to convert the first layer into a material layer; and, while exposing the substrate to the plasma, changing the repetition frequency.

In still another embodiment, a method for processing a substrate includes loading a substrate into a process chamber; generating source power pulses having a pulse frequency that varies from a first frequency to a different second frequency; performing a cyclic deposition process that includes a plurality of deposition cycles, one of the deposition cycles including: performing a first deposition process that includes flowing a silicon precursor with formula $Si_nH_{2n+2-m}Cl_m$ ($n \geq 1$ and $0 \leq m \leq 2n+2$) into the process chamber and exposing the substrate to the silicon precursor to deposit a silicon layer; and performing a second deposition process that includes flowing a nitrogen precursor into the process chamber, powering a source electrode of the process chamber with the source power pulses to generate a plasma, and, while varying the pulse frequency applied to the source electrode from the first frequency to the second frequency, exposing the substrate to the plasma to deposit a nitride layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a cross-sectional schematic view of plasma processing apparatus generating inductively coupled plasma for use in a deposition process, the generating comprising powering a source electrode with source power pulses of variable pulse frequency, in accordance with various embodiments;

FIGS. 2A-2D provide a comparison between continuous-wave source power and single source power pulses with a finite pulse period and varying duty cycle but identical (pulse period-averaged) power, wherein FIG. 2A illustrates the continuous-wave source power and FIGS. 2B-2D respectively illustrate pulses with duty cycles of 50%, 25%, and 75%, in accordance with various embodiments;

FIGS. 5A-5C depict cross-sectional views of a substrate being processed in accordance with various embodiments, wherein FIG. 5A illustrates a first deposition process depositing a first layer, FIG. 5B illustrates a second deposition process comprising exposure of the substrate to a plasma to convert the first layer into a material layer, and FIG. 5C illustrates the result of three deposition cycles forming three layers over the substrate;

FIGS. 6A-6C depict cross-sectional views of a substrate being processed in accordance with various embodiments, wherein FIG. 6A illustrates a first deposition process depositing a first layer, FIG. 6B illustrates a second deposition process comprising exposure of the substrate to a plasma to deposit a second layer, and FIG. 6C illustrates the result of three deposition cycles forming a six-layer laminate over the substrate;

DETAILED DESCRIPTION OF ILLUSTRATIVE EMBODIMENTS

Figures 3A, 3B, 4A, 4B:
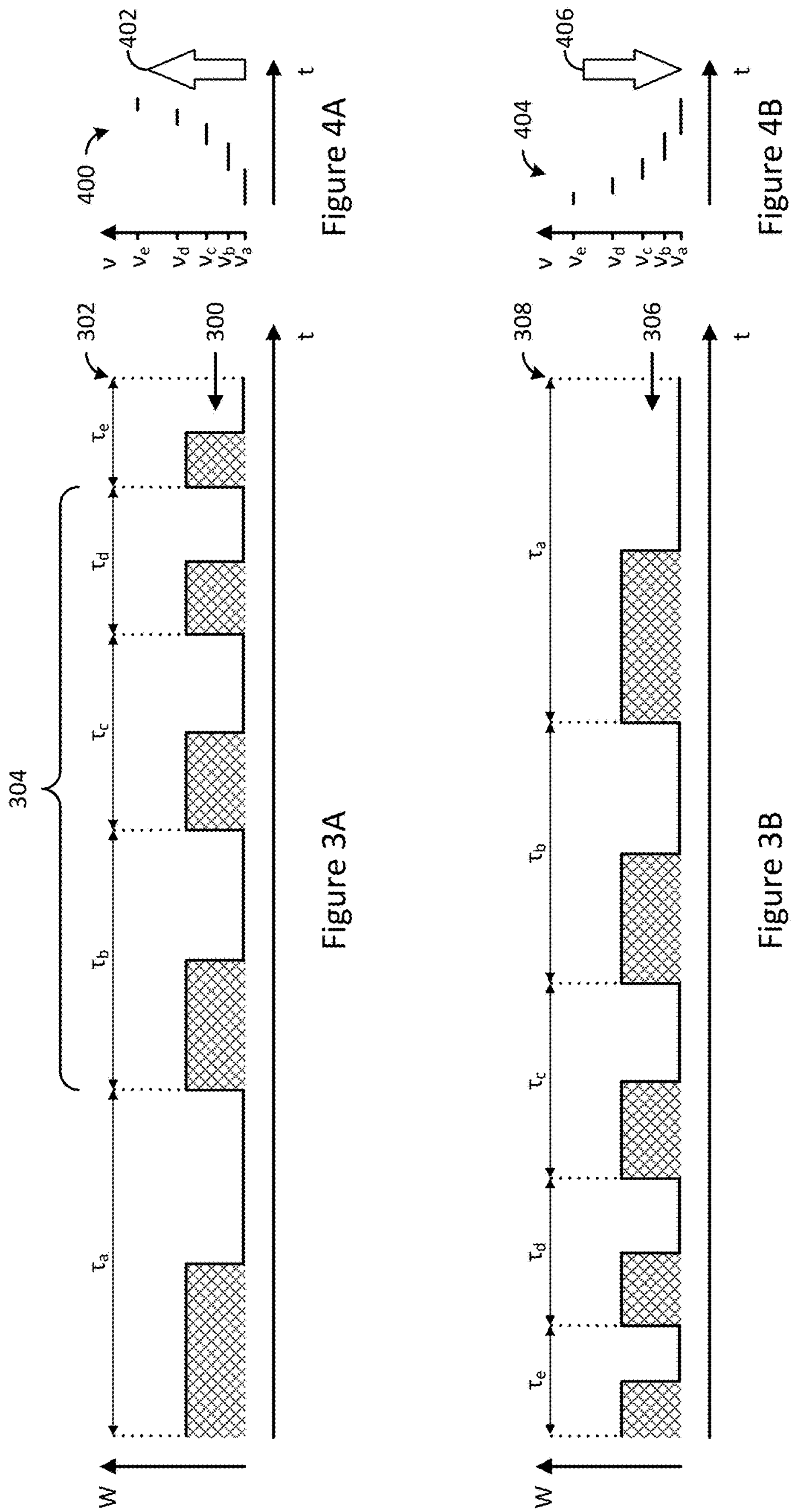
FIGS. 3A and 3B depict pulse sequences with continuously and monotonically varying pulse frequency, the pulse frequency increasing in FIG. 3A and decreasing in FIG. 3B, in accordance with various embodiments.
FIGS. 4A and 4B provide complementary plots of the pulse frequency as a function of time during the pulse sequences of FIGS. 3A and 3B, in accordance with various embodiments.

Plasma-enhanced deposition methods, such as plasma-enhanced atomic layer deposition (PEALD) and plasma-enhanced chemical vapor deposition (PECVD), have a variety of attractive features. Relative to purely thermal processes, plasma enhancement allows for lower process temperatures; expands the range of possible precursor chemicals by increasing precursor reactivity; generates highly energetic species that modify conditions at the substrate surface and drive chemical reactions; and improves conformality of the deposition. Plasma-enhanced deposition methods thus provide better control over film composition and structure than the corresponding plasma-free methods.

A plasma comprises a variety of ions and neutral radicals, together with unbound electrons and un-ionized process gases. Interactions between these constituents and the substrate surface determine the mechanism of the plasma-enhanced deposition. For example, neutral radicals (or neutrals) may adsorb onto the substrate surface, contributing to material growth, while ions may bombard the surface, potentially causing desorption of adsorbed neutrals or even sputtering of substrate particles. Some neutrals are highly reactive, and they may participate in surface reactions that do not advance (and may even reverse) the progress of deposition. The relative abundances of different neutral species in the plasma may therefore affect both the rate of deposition and the properties of the deposited material.

Given a plasma chemistry comprising a precursor and a carrier gas, the balance among neutrals in the corresponding plasma can be tuned by changing the overall process pressure, by rebalancing the partial pressures of the precursor and the carrier gas, or by selecting a different source power. But because these process parameters may be preselected to optimize macroscopic parameters of the plasma-such as electron density, ion energies, or uniformity-changing any one of them may undermine plasma stability or degrade overall process quality. New approaches are desired that preserve the salutary features of existing methods while allowing for finer control of the underlying plasma chemistry and of the deposition itself.

Many plasma-enhanced deposition methods involve supplying power to the plasma from a continuous-wave radio-frequency (RF) source. When continuous-wave source power is switched ON to generate and sustain a plasma, the density of each neutral species formed in the plasma may saturate at a different characteristic value. The density at saturation need not be correlated with the rate of saturation: high density may be attained by some neutrals with a slow rise and by others with a fast spike. Similar statements may hold for low-density neutrals.

These density variations before saturation, or density transients, may therefore be characterized by time-dependent ratios among the various neutral species that may differ from the ratios at saturation. Fluxes of the various neutrals at the surface of the substrate (and ratios between them) may exhibit similar transients and thus may result in modulation of the associated surface chemistry.

Other conventional methods may use pulsed RF source power supplied at a constant pulse frequency, a pulsed RF bias power applied to a substrate holder, or both. Pulsed power schemes may be designed to promote plasma uniformity, control the plasma temperature, and shape the plasma sheath. Pulsed bias power may also modulate the directionality and energies of ions bombarding the substrate.

When source power is pulsed, each pulse comprises an ON period (active glow discharge) and an OFF period (afterglow). Matching the average power per pulse (also referred to as pulse period-averaged power, or simply average power) to the continuous-wave value requires higher instantaneous power during the ON period. A correspondingly higher flux of energy into the plasma alters the ionization and fragmentation dynamics of the precursors and modulates the neutral density transients. When the power is switched back OFF, the slower recombination chemistry of the neutrals may be observed as an additional set of density transients. Averaging the density over the steeper, rising glow transients and the gentler, falling afterglow transients yields a pulse-averaged density for each neutral species that may be different from the continuous-wave saturation density. Similar statements may hold for neutral fluxes (and ratios between them) at the surface of the substrate.

The inventors have performed extensive simulations showing that density-transient modulations in a pulsed plasma may be strong enough to affect the resulting deposition chemistry, without further modifications to the process conditions. For example, changing the pulse frequency may advantageously increase the average density of neutrals required for deposition relative to the average density of neutrals that tend to slow or reverse it. In effect, pulse shaping of the neutral density and flux transients provides an independently addressable control mechanism for plasma-enhanced deposition.

Accordingly, various embodiments of the present disclosure provide methods that comprise changing the source power pulse frequency during deposition. Some embodiments comprise varying the pulse frequency continuously and monotonically from an initial value to a final target value, consistent with the inventors' observation that ramping the pulse frequency may provide a stronger modulation of time-averaged neutral densities than achievable by a discrete switch.

To provide perspective on the embodiments discussed in this application, an example plasma processing apparatus will be described with reference to FIG. 1. Various pulse characteristics and embodiment source-power pulsing schemes will then be described with reference to FIGS. 2A-2D, 3A/3B, and 4A/4B. Processes comprising plasma-enhanced deposition according to embodiments will be illustrated with reference to FIGS. 5A-5C and 6A-6C. A detailed example of the relationship between source-power pulse frequency and radical abundances in plasma-enhanced ALD of silicon nitride is then presented with reference to FIGS. 7-9. Finally, embodiment methods are described with reference to the flow charts of FIGS. 10-12.

FIG. 1 illustrates a cross-sectional schematic view of an apparatus configured to generate an inductively coupled plasma (ICP). The ICP apparatus comprises a plasma processing chamber 100. A substrate 102 may be disposed over a substrate holder 104 within the plasma processing chamber 100, and a plasma 126 generated from process gases by a radio-frequency (RF) source power supply 114 producing source power pulses may be used to deposit a material layer 134 over the substrate 102.

The substrate 102 represents generically any suitable semiconductor substrate being processed in accordance with embodiments of the present invention. The substrate 102 may include bulk substrates such as silicon wafers, silicon-on-insulator (SOI) wafers, or any of various other semiconductor substrates. The substrate 102 may also be coated or layered with additional materials, including compound semiconductors, metal or metalloid oxides, or metal or metalloid nitrides. In some embodiments, the substrate 102 may include any material portion or structure of a device; in other embodiments, the substrate 102 may be patterned or embedded in a larger semiconductor structure or device, such as a reconstituted wafer in a wafer-level package process.

The ICP apparatus comprises a gas inlet 106 that permits a gas in-flow 108 of process gas into the plasma processing chamber 100. A gas outlet 110 allows for pressure control within the plasma processing chamber 100 as well as charging, continuous flow, or evacuation of the process gases, as indicated by a gas out-flow 112. The gas inlet 106 and gas outlet 110 may be coupled to and controlled by a gas-flow control system comprising control circuitry, gas canisters, piping, tubing, valves, pressure sensors, flow sensors, pumps, and the like. In various embodiments, a total process pressure may be between 0.1 mtorr and 100 torr, with a corresponding total flow rate of the associated process gas being between 1 sccm and 5000 sccm.

In various embodiments, the process gas may comprise any gas or set of gases capable of generating the plasma 126 and depositing the desired material layer 134. In some embodiments, the process gas may comprise a noble gas, such as helium, argon, neon, or krypton; elemental hydrogen ($H_2$), elemental nitrogen ($N_2$), or elemental oxygen ($O_2$); an oxygen-containing gas, such as nitrous oxide ($N_2O$), carbon dioxide ($CO_2$), water vapor ($H_2O$), or ozone ($O_3$); or any ratio, combination, or admixture thereof.

In some embodiments comprising a plasma-enhanced nitridation step in PEALD of silicon nitride, the process gas (or nitrogen precursor) may comprise an azane, such as ammonia ($NH_3$) or hydrazine ($N_2H_4$), in any ratio, combination, or admixture with another azane, $H_2$, or a noble gas. In some such embodiments, a total process pressure may be between 0.1 mtorr and 100 torr, with a corresponding total flow rate of 1 sccm to 5000 sccm, and with a ratio of an azane flow rate to a noble-gas flow rate between 1:100 and 4:1. In certain of these embodiments, the process gas (or nitrogen precursor) may comprise ammonia and argon at a total process pressure of 300 mtorr and with a ratio of an ammonia flow rate to an argon flow rate of 1:4.

In other embodiments comprising PECVD of silicon-containing layers, the process gas may comprise a silicon precursor, such as a silane ($Si_nH_{2n+2}$ with integer n≥1); a halogenated silane, such as a chlorosilane ($Si_nH_{2n+2-m}Cl_m$ with integer n≥1 and integer m between 1 and 2n+2, the m=0 compounds being silanes); or a metal-organic compound, such as tetramethylsilane (TMS, $Si(CH_3)_4$), tetramethyldisilazane (TMDS, $[(CH_3)_2Si]_2NH$), hexamethyldisilazane (HMDS, $[(CH_3)_3Si]_2NH$), or tetraethyl orthosilicate (TEOS, $Si(OC_2H_5)_4$). In certain embodiments, the silicon precursor may be silane itself ($SiH_4$), dichlorosilane ($SiH_2Cl_2$) or hexachlorodisilane ($Si_2Cl_6$).

In some embodiments comprising PECVD of silicon-containing layers, the silicon precursor may be in any ratio, combination, or admixture with other silicon precursors and with other process gases, such as those described above. Other process gases may serve as sources of oxygen, nitrogen, or both, as may be desired for depositing silicon oxide (e.g., $SiH_4$—SiO or TEOS-SiO), silicon nitride, or silicon oxynitride, according to various embodiments.

In some embodiments, the gas inlet 106 may comprise a set of multiple gas inlets or even a showerhead comprising a plurality of narrowly spaced gas inlets disposed above the entirety of the substrate 102. In some such embodiments, a set or plurality of gas inlets may be partitioned into subsets, each subset being configured to deliver a single process gas. In other embodiments, the gas inlet 106 may comprise a gas mixer, such that a homogeneous mixture of process gases may be delivered into the plasma processing chamber 100. Certain embodiments may also incorporate center/edge splitters, such that gas flow rates at the edge of the substrate 102 may be adjusted independently. In some embodiments, the gas outlet 110 may comprise a set of multiple gas outlets.

In various embodiments, one or more gas sensors may be disposed directly within the plasma processing chamber 100. Suitable gas sensors may include pressure sensors, flow sensors, or sensors for detecting process gases or measuring process gas densities. In some embodiments, the plasma processing chamber 100 may include a sampling orifice or sipper connected to analytical equipment, such as a mass spectrometer.

The plasma 126 may be generated and subsequently sustained within the plasma processing chamber 100 once any process gases have been established at a selected total pressure. To that end, the RF source power supply 114 may be connected to an inductive coil 122 winding around the plasma processing chamber 100; the small circles in FIG. 1 represent cross-sections of the inductive coil 122 as it passes through the sectioning plane. As illustrated, the inductive coil 122 is coupled to the interior of the plasma processing chamber 100 by dielectric windows 124, which allow the induced RF field to penetrate into the plasma processing chamber 100.

According to various embodiments, the operating pulse frequency range of the source power supply 114 may be between 1 Hz and 10 MHz. In various embodiments, the operating wattage of the source power may be between 10 W and 10 KW. In one embodiment, the source power may be 400 W. While a single source power supply 114 is illustrated in FIG. 1, more than one source power supply may be used in some embodiments, for example, to provide a low-frequency RF power and a high-frequency RF power simultaneously, or to enable faster switching of the source pulse frequency.

The source power supply 114 is connected to a ground 116 and may be coupled to the inductive coil 122 through a source control system 118 and a blocking capacitor 120.

According to various embodiments, the source control system 118 may work in concert with the source power supply 114 to generate source power pulses characterized by one or more control parameters (such as wattage, pulse frequency, or duty cycle) and to supply the source power pulses to the inductive coil 122. In some embodiments, the source control system 118 may be programmable, with control instructions stored in software, firmware, hardware, or a combination thereof. The source control system 118 may further comprise impedance-matching circuitry, though in some embodiments a separate match box may be used.

The plasma 126 generated within the plasma processing chamber 100 may enhance deposition onto the substrate 102 and facilitate formation of the material layer 134, which may (in various embodiments) comprise silicon oxide, silicon nitride, silicon oxynitride, or another material. Varying the pulse frequency of the source power may enable advantageous modulation of average neutral densities in the plasma 126, as well as modulation of the ratios between them. Accordingly, various embodiments enable process control by influencing the underlying chemistry of the deposition.

In addition to physically supporting the substrate 102, the substrate holder 104 may (in some embodiments) serve as a bias electrode, being connected through a bias control system 128 to an RF bias power supply 130 (which is, in turn, connected to ground 132). Other embodiments may omit the bias control system 128 and the bias power supply 130, such that the substrate holder 104 may be connected directly to the ground 132. In still other embodiments, the ground 132 may be a chassis ground connected to the plasma processing chamber 100, with the substrate holder 104 left floating.

According to various embodiments, bias power (excitation) pulses applied to the substrate holder 104 by the bias power supply 130 may have a frequency between 100 kHz and 10 GHz. While a single bias power supply 130 is illustrated in FIG. 1, more than one bias power supply may be used in some embodiments, for example, to provide a low-frequency RF power and a high-frequency RF power simultaneously, or to enable faster switching of the bias frequency.

The bias control system 128 may be similar to the source control system 118 and may work in concert with the bias power supply 130 to supply bias power pulses to the substrate holder 104. In some embodiments, the source control system 118 and the bias control system 128 may be coupled together or may be parts of a higher-level control system. In certain of these embodiments, additional control parameters may include a delay time between source power pulses and bias power pulses or a phase shift between the source power supply 114 and the bias power supply 130. In other words, coupling the control systems may enable synchronous or asynchronous, single- or dual-phase schemes for source and bias power pulses.

In various embodiments, the substrate holder 104 may serve one or more additional functions. For example, the substrate holder 104 may be integrated with a chuck to secure the substrate 102; may be augmented with a focus ring to ensure process consistency at the edge of the substrate 102; may be coated with a conductive material or integrated with a backside-gas system to improve thermal contact with the substrate 102; and so on.

According to various embodiments, a process temperature of the substrate 102 may be between −200° C. and 500° C. The substrate holder 104 may therefore be coupled to or integrated with a temperature control system comprising a temperature sensor, such as a thermocouple, a thermistor, a resistance temperature detector, or a suitably configured integrated circuit. In embodiments comprising a process temperature above room temperature, the temperature control system may comprise a heating element, such as a resistive heater.

In other embodiments comprising a process temperature below room temperature, the temperature control system may comprise a chiller that circulates a suitable working fluid through one or more coolant channels in the substrate holder 104. For process temperatures above −100° C., the working fluid may comprise a conventional refrigerant (such as a fluorocarbon); for process temperatures below −100° C., the working fluid may comprise a cryogenic liquid (such as liquid nitrogen).

Embodiments of the present disclosure may comprise the use of apparatus other than the ICP apparatus illustrated in FIG. 1. For example, an ICP apparatus may comprise a planar inductive coil disposed over a top dielectric window in the plasma processing chamber 100. Other embodiments may employ other types of plasma, such as single- or multi-frequency capacitively coupled plasma (CCP) generated by one or more electrodes disposed within the plasma processing chamber 100; microwave plasma; electron cyclotron resonance plasma; or helicon plasma from a helical resonator.

Still other embodiments may comprise remote plasma systems—in which the plasma 126 is physically isolated, and neutrals are extracted from it for delivery to the substrate 102—or batch plasma systems. In the latter embodiments, the substrate holder 104 may support a plurality of substrates and may spin around a central axis to carry them through different zones of the plasma processing chamber 100. These zones may comprise independent gas inlets and outlets delivering process gases suitable for distinct plasma processes or for plasma-free precursor or purge steps (as may be desirable for PEALD).

FIGS. 2A-2D illustrate continuous-wave power and power pulses that may be generated by the source power supply 114 in concert with the source control system 118 and used to power the inductive coil 122 in order to generate and sustain the plasma 126. Several control parameters of the source power may be apparent from the illustrations and the discussion that follows, but others may be identified, set, and controlled in various embodiments.

FIG. 2A depicts a continuous-wave power 200 using a graph of the instantaneous wattage W as a function of time t. (In some embodiments, the continuous-wave power 200 may be RF in the 13.56 MHz ISM band. In other embodiments, the continuous-wave power 200 may be at another high, very high, or ultra-high frequency.) The continuous-wave power 200 is switched ON at a time to with a wattage $W_0$ and kept ON indefinitely, e.g., for the duration of a plasma-enhanced deposition process.

In accordance with various embodiments, the source power supplied to the inductive coil 122 may instead be pulsed. Pulses comprise a length of time during which the source power is switched ON followed by another length of time during which the source power is switched OFF (an ON time and an OFF time, respectively, forming a single ON-OFF switching cycle). In some embodiments, the wattage during the ON time is held constant, such that a single pulse (or a sequence or train of pulses) may be described by a time-dependent wattage function W (t) that is piecewise constant and consists of alternating regions of positive and zero wattage. In other embodiments, the wattage may be varied within the ON time of an individual pulse, as may be useful for achieving additional fine control of the deposition.

In FIG. 2B, a pulse 202 is switched ON at a time to and subsequently switched OFF at a time $t_1$, remaining OFF until a time $t_2$ (when the source power may once again be switched ON to initiate another pulse, not illustrated). In some embodiments, the ON time and the OFF time may be control parameters of the pulse 202, in this case taking the values $\tau_{ON}=(t_1-t_0)$ and $\tau_{OFF}=(t_2-t_1)$, as illustrated by an interval 206 and an interval 208, respectively. The ON and OFF times then sum to yield a pulse period $\tau=(\tau_{ON}+\tau_{OFF})=(t_2-t_0)$, as illustrated by an interval 210.

In other embodiments, the pulse period may be a control parameter of the pulse 202, with the ON time and the OFF time being set by another control parameter, a duty cycle d that may take a value in the open interval (0, 1). Given a value of the pulse period and a choice of d, the ON time and the OFF time take the values $\tau_{ON}=d\tau$ and $\tau_{OFF}=(1-d)\tau$, such that the pulse is ON for 100d % of the pulse period. The pulse 202 of FIG. 2B has d=0.50, a 50% duty cycle, such that $\tau_{ON}=\tau_{OFF}=(\tau/2)$.

Another control parameter of a pulse may be the wattage during the ON time, $W_{ON}$. If the pulse 202 were applied with a wattage $W_{ON}=W_0$, the total amount of energy delivered by the inductive coil 122 to generate and sustain the plasma 126 during the pulse period would be reduced by half relative to that supplied by the continuous-wave power 200 over a comparable interval. Some embodiments may comprise reducing or increasing the power relative to a typical choice of the continuous-wave power wattage during one pulse, some pulses, or every pulse.

In other embodiments, and as illustrated, pulses may be generated such that a pulse period-averaged wattage (or simply an average wattage) remains constant from pulse to pulse and may be matched to a typical continuous-wave wattage for a deposition process of interest. An average wattage for piecewise constant pulses such as pulse 202 may be obtained from the equation:

$$W_{avg}=\frac{1}{t_2-t_0}\int_{t_0}^{t_2}W(t)dt=\frac{1}{\tau}\int_0^{\tau}W(t')dt'=\frac{W_{ON}}{\tau}\int_0^{d\tau}dt=dW_{ON} \quad \text{(Equation 1)}$$

In embodiments for which the duty cycle is not a control parameter, the value of d may be determined from the ON time for purposes of changing variables, i.e., from $d=(\tau_{ON}/\tau)$.

Equation 1 shows that the average wattage during the pulse period is simply a fraction of $W_{ON}$ set by the duty cycle d. To match the average power $W_{avg}$ with a target continuous-wave power $W_0$, we may thus choose $W_{ON}=(W_0/d)$. For example, the 50% duty cycle pulse 202 may have a wattage $W_{ON}=2W_0$ during the ON time and an average wattage $W_{avg}=W_0$, as illustrated by the half-half-dashed line 204 in FIG. 2B.

FIGS. 2C and 2D depict additional examples of piecewise constant pulses having the same pulse period 210 and average wattage 204 as pulse 202. Specifically, FIG. 2C illustrates a 25% duty cycle pulse 212 with $W_{ON}=4W_o$, and FIG. 2D illustrates a 75% duty cycle pulse 214 with $W_{ON}=(4/3)\ W_o$. Pulses with shorter duty cycles and higher instantaneous power relative to the continuous-wave power 200 may modulate neutral densities more strongly and may be advantageous for some processes.

Any of the pulses illustrated in FIGS. 2B-2D may be a single representative pulse from a pulse train extending backward in time, forward in time, or both, such that the pulse train spans the plasma-enhanced portion of a deposition process, according to various embodiments. In some embodiments, the pulse train may be any of multiple pulse trains generated in the course of a plasma-enhanced cyclic deposition process. In other embodiments, the entire deposition process may be plasma-enhanced.

In some embodiments, all of the pulses may be chosen to have the same pulse period T, such that the pulse frequency (or repetition frequency) of the pulse train may be determined from the standard relationship $\nu=(1/\tau)$. According to various other embodiments, each pulse $P_i$ (integer i=1, 2, 3, . . . ) may begin at a time $t_i$ and have a separately selected pulse period $\tau_1$, such that $t_{i+1}=(t_i+\tau_i)$ and a corresponding pulse frequency (or repetition frequency) may be $\nu_i=(1/\tau_i)$. The individual pulse frequencies together define a piecewise-constant instantaneous frequency function $\nu(t)=\nu_i \Lambda t\in[t_i,t_{i+1})$ for the pulse train.

Changing the pulse frequency may comprise selecting different frequencies $\nu_i\neq\nu_{i+1}$ for any pair of successive or time-adjacent pulses in the pulse train, according to embodiments. Changes may be from lower frequency to higher frequency $(\nu_{i+1}>\nu_i)$ or from higher frequency to lower frequency $(\nu_i>\nu_{i+1})$, as may be desirable for a given deposition process. In some embodiments, the lower frequency may be between 1 Hz and 10 Hz. In these and other embodiments, the higher frequency may be between 10 kHz and 10 MHz.

Some embodiments may comprise changing the pulse frequency once, such that the instantaneous frequency function has a single discontinuity, and other embodiments may comprise changing the pulse frequency multiple times. Certain embodiments may even comprise selecting pulse frequencies such that every pulse has a frequency different from those that directly precede or follow it. In some of these latter embodiments, every pulse in a train may have a unique frequency.

A subset of N time-adjacent pulses from a pulse train is a pulse sequence $\{P_i, P_{i+1}, \ldots, P_{i+N-1}\}$. In some embodiments, a pulse train may comprise an initial pulse sequence within which the pulse frequency changes, with the pulse frequency held constant thereafter; in other embodiments, the pulse frequency may initially be held constant and then changed over the course of a final pulse sequence. In still other embodiments, multiple pulse sequences comprising one or more frequency changes may be interspersed among pulse sequences that may have the same or different constant frequencies.

Changes in frequency from an initial frequency $\nu_k$ to a final frequency $\nu_l$ may be from a lower frequency to a higher frequency $(\nu_k<\nu_l)$ or from a higher frequency to a lower frequency $(\nu_k>\nu_l)$, according to various embodiments. In some embodiments, a frequency change may be made in a single step spanning a sequence of two pulses, $\{P_i, P_{i+1}\}$. In other embodiments, a frequency change from a first frequency to a second frequency may comprise ramping over one or more intermediate frequencies, such that the frequency change spans a pulse sequence with N≥3. In embodiments comprising ramping, the frequency change may be carried out over any convenient time period. In some such embodiments, the ramping may occur over a time period between 10 μs and 1 s.

In some embodiments, ramping may be continuous, such that every successive pulse within the sequence has a different frequency, $\nu_k=\nu_i\neq\nu_{i+1}\neq \ldots \neq\nu_{i+N-2}\neq\nu_{i+N-1}=\nu_l$. ("Continuous" here is not meant to imply continuity in the mathematical sense, but rather that the frequency change never pauses once it has begun and stops only when the final frequency $\nu_l$ has been reached.) In other embodiments, ramping may be monotonic, such that the pulse frequencies are ordered, $\nu_k=\nu_i<\nu_{i+1}\leq \ldots \leq\nu_{i+N-2}<\nu_{i+N-1}=\nu_l$ (monotonically increasing) or $\nu_k=\nu_i>\nu_{i+1}\geq \ldots \geq\nu_{i+N-2}>\nu_{i+N-1}=\nu_l$ (monotonically decreasing). In still other embodiments, ramping may be both continuous and monotonic, such that the pulse frequencies within the sequence are all different and ordered, $\nu_k=\nu_i<\nu_{i+1}< \ldots <\nu_{i+N-2}<\nu_{i+N-1}=\nu_l$ (continuously and monotonically increasing) or $\nu_k=\nu_i>\nu_{i+1}> \ldots >\nu_{i+N-2}>\nu_{i+N-1}=\nu_l$ (continuously and monotonically decreasing).

FIGS. 3A and 3B depict two example pulse sequences that ramp continuously and monotonically; FIGS. 4A and 4B provide corresponding plots of the instantaneous frequency $\nu(t)$. While the pulse sequences depicted all comprise 5 pulses, and while each pulse depicted has a 50% duty cycle, those choices were made merely to simplify the illustration. Different values of N and d may be selected as appropriate for a given embodiment.

In FIG. 3A, pulse sequence 300 consists of 5 pulses $\{P_a, P_b, P_c, P_d, P_e\}$ with continuously decreasing pulse period $\{\tau_a<\tau_b<\tau_c<\tau_d<\tau_e\}$, as indicated by labeled intervals 302. If the inner three pulses indicated by bracket 304 were to be reordered, pulse sequence 300 would no longer be monotonic (but it would remain continuous). Because the corresponding instantaneous frequencies are inversely proportional to the pulse periods, plot 400 of FIG. 4A shows a monotonic frequency increase, $\{\nu_a<\nu_b<\nu_c<\nu_d<\nu_e\}$, as indicated by arrow 402.

In FIG. 3B, pulse sequence 300 has been reversed to yield pulse sequence 306, which consists of the same 5 pulses, but now ordered such that the pulse period is continuously increasing, as indicated by labeled intervals 308. Plot 404 of FIG. 4B shows a corresponding monotonic decrease in the instantaneous frequency, $\{\nu_e>\nu_d>\nu_c>\nu_b>\nu_a\}$, as indicated by arrow 406.

In general, embodiments need not comprise any prescribed relationship among the pulse periods and frequencies of pulses in a pulse sequence. But in some embodiments, ramping may implement a frequency chirp as a function of a pulse number within the sequence (rather than as a function of time). For example, the pulses in FIGS. 3A/3B are depicted with pulse periods that change from Ta to tb (and so on) by a fixed geometric factor, such that the same change is exhibited (inversely) in the frequencies of FIGS. 4A/4B.

In various embodiments, frequency chirps implemented by ramping across a pulse sequence may be linear, geometric, or hyperbolic. Pulse frequencies for each member of a pulse sequence $\{P_1, P_2, \ldots, P_N\}$ may be determined, in some embodiments, from a first frequency vi, a second frequency $\nu_N$, and a desired number of pulses N≥3, according to the following equations (with integer p between 0 and N-1):

$$\nu_p = \frac{(\nu_N - \nu_1)}{N-1}p + \nu_1 \quad \text{(Equation 2)}$$

$$\nu_p = \nu_1\left(\frac{\nu_N}{\nu_1}\right)^{\frac{p}{N-1}} \quad \text{(Equation 3)}$$

$$\nu_p = \frac{\nu_1\nu_N(N-1)}{(\nu_1-\nu_N)p+\nu_N(N-1)} \quad \text{(Equation 4)}$$

Equations 2, 3, and 4 respectively correspond to linear, geometric, and hyperbolic chirp. Given the pulse frequencies from one of the above equations, the corresponding pulse periods may be determined as described above.

FIGS. 5A-5C and 6A-6C provide schematic cross-sectional illustrations of embodiment deposition processes that may incorporate a pulsed plasma with changing pulse frequency. In these figures, structures also depicted in FIG. 1 are labeled with matching reference numerals.

Figure 5A:
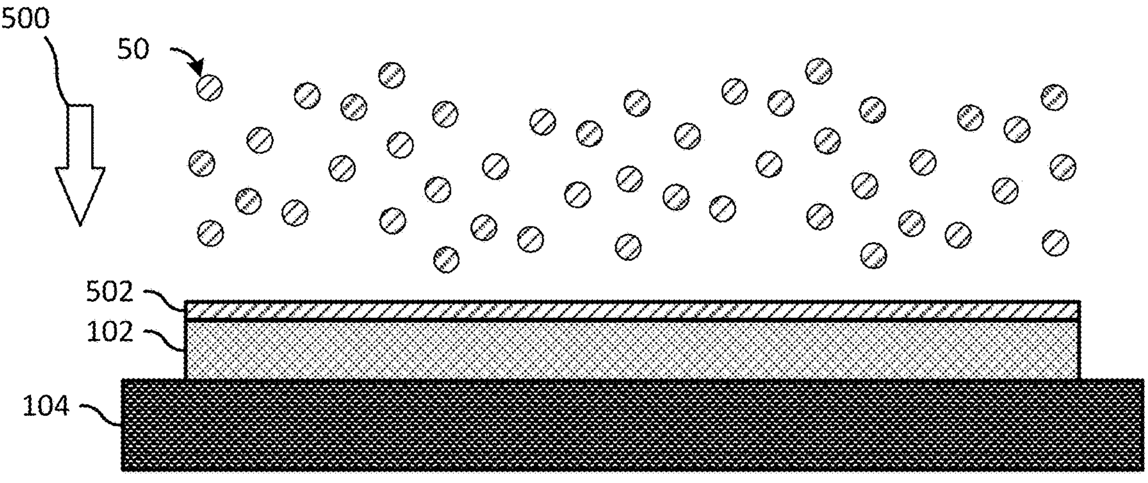

In FIG. 5A, a first process gas 50 is flowed into the plasma processing chamber 100 and toward the surface of the substrate 102 disposed over the substrate holder 104, as indicated by arrow 500. Exposure to the first process gas 50 deposits a first layer 502 onto the surface of the substrate 102.

Figure 5B:
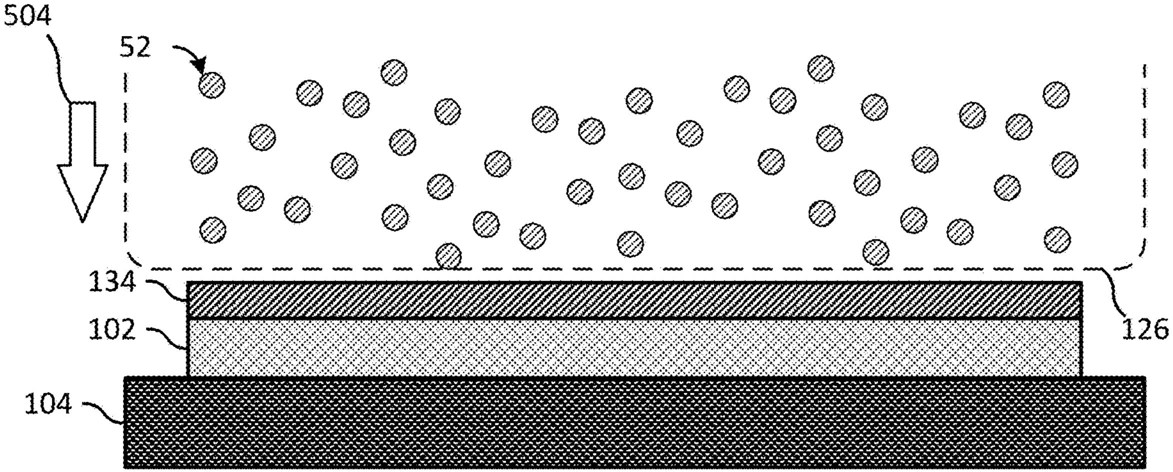

In FIG. 5B, a second process gas 52 is flowed into the plasma processing chamber 100 and toward the surface of the substrate 102 (and the first layer 502), as indicated by arrow 504. The plasma 126 is then generated using source power pulses supplied to the inductive coil 122 by the source power supply 114 in concert with the source control system 118. Modulation of neutral densities in the plasma 126 and thus the fluxes (and ratios of fluxes) of neutral species at the surface of the first layer 502 may serve to control the surface chemistry and facilitate conversion of the first layer 502 into the material layer 134.

In some embodiments, the process step depicted in FIG. 5A may be a non-plasma-enhanced precursor step in a multi-step ALD process, such as the silicon precursor step in PEALD for silicon nitride. In these embodiments, the first process gas 50 may comprise a silane ($Si_nH_{2n+2}$ with integer n≥1) or a halogenated silane, such as a chlorosilane ($Si_nH_{2n+2-m}Cl_m$ with integer n≥1 and integer m between 1 and 2n+2). In certain embodiments, the first process gas 50 may comprise silane itself ($SiH_4$), dichlorosilane, or hexachlorodisilane. In embodiments comprising ALD, a purge step (not illustrated) may follow, in which a purge gas (such as a noble gas or a relatively inert gas such as nitrogen) may be flowed into the chamber to remove residual portions of the first process gas, the second process gas, or both.

Other embodiments may comprise PECVD or other plasma-enhanced deposition processes in which all precursors are flowed into the plasma processing chamber 100 simultaneously prior to generation of the plasma 126. In these embodiments, the process step depicted in FIG. 5A may be omitted entirely.

According to various embodiments, the deposition process depicted in FIGS. 5A and 5B may be performed once or may be part of a single cycle of a cyclic deposition process. In some embodiments comprising cyclic deposition, frequencies of the source power pulses may be varied according to the same protocol in every cycle. That is, the initial frequency, the final frequency, and (in some such embodiments) any intermediate frequencies may be the same. In other embodiments comprising cyclic deposition, frequency changes may be different from cycle to cycle in order to enable tailored, per-cycle control of the surface chemistry.

Figure 5C:
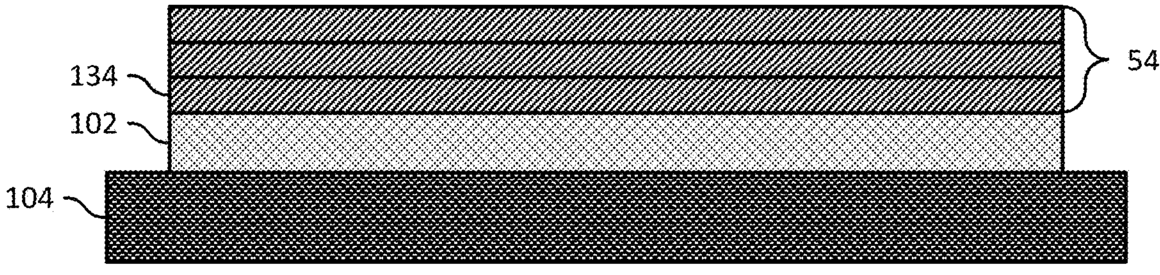

In embodiments comprising cyclic deposition, the process may be repeated as many times as may be desired to deposit a target thickness of material. FIG. 5C depicts the result of repeating the process steps of FIGS. 5A/5B three times, such that a material layer stack 54 has been deposited over the substrate 102. In embodiments comprising PEALD, the interfaces depicted in FIG. 5C between individual layers of the stack 54 may not be detectable physical boundaries, owing to the sub-monolayer deposition typical of a given cycle.

Figure 6A:
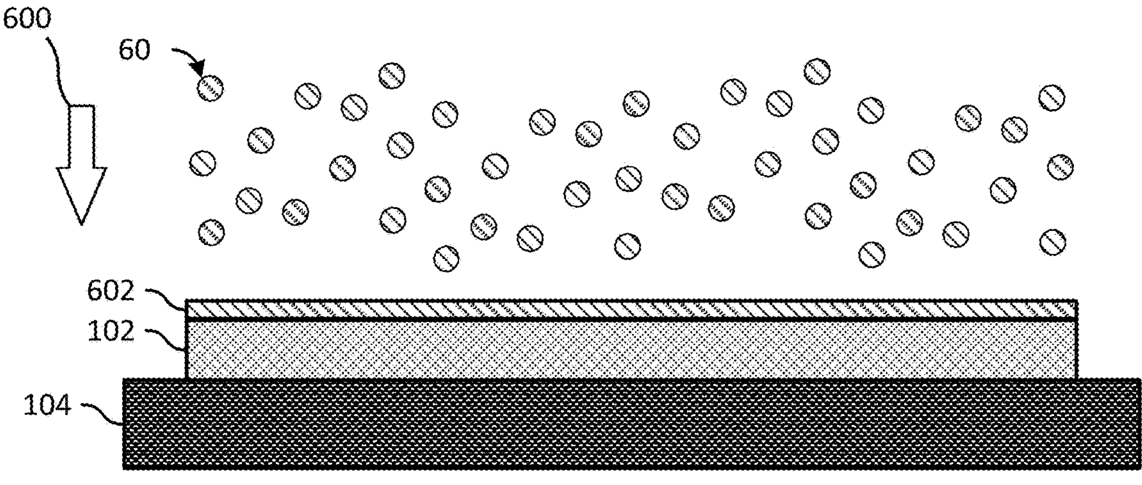
Figure 6B:
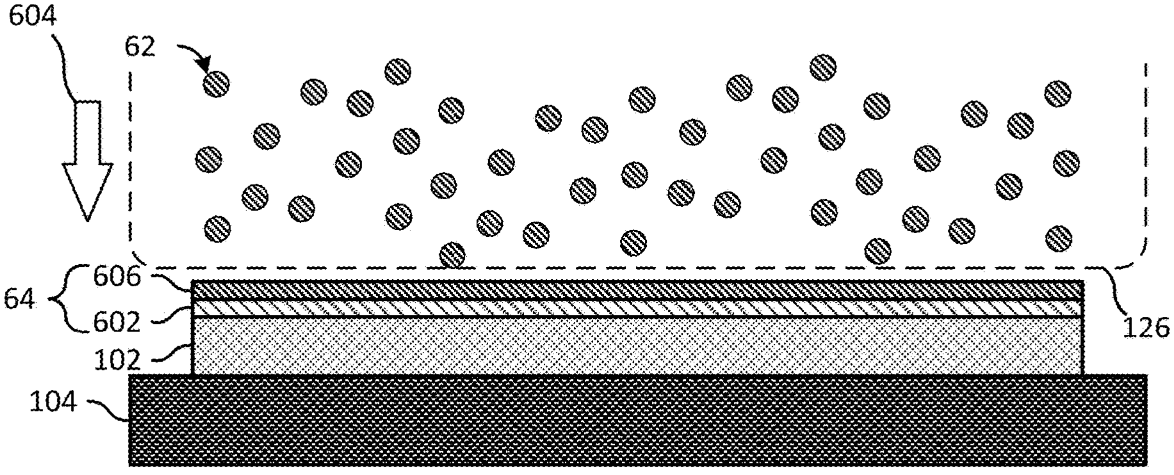
Figure 6C:
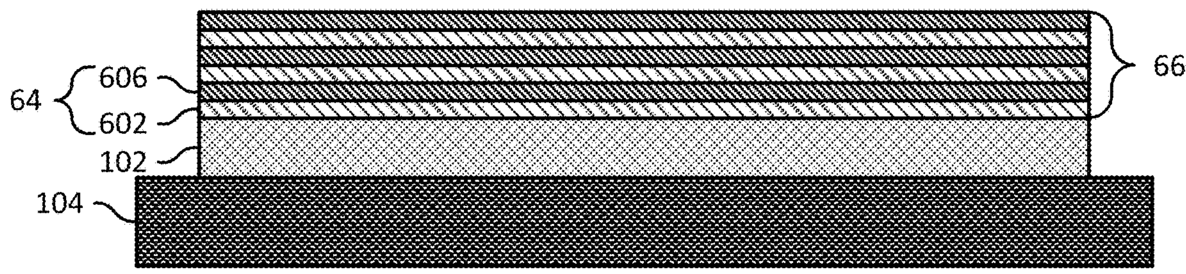

FIGS. 6A-6C depict a similar process flow, but rather than forming the material layer 134, which has a homogeneous composition, a material bilayer 64 is formed.

In FIG. 6A, a first process gas 60 is flowed into the plasma processing chamber 100 and toward the surface of the substrate 102 disposed over the substrate holder 104, as indicated by arrow 600. Exposure to the first process gas 60 deposits a first layer 602 onto the surface of the substrate 102. In embodiments comprising PEALD of silicon nitride, the first layer 602 may be a silicon layer. In embodiments comprising PECVD, the process step depicted in FIG. 6A may be omitted entirely.

In FIG. 6B, a second process gas 62 is flowed into the plasma processing chamber 100 and toward the surface of the substrate 102 (and the first layer 602), as indicated by arrow 604. The plasma 126 is then generated using source power pulses supplied to the inductive coil 122 by the source power supply 114 in concert with the source control system 118. Modulation of neutral densities in the plasma 126 and thus the fluxes (and ratios of fluxes) of neutral species at the surface of the first layer 602 may serve to control the surface chemistry and facilitate deposition of the second layer 606 over the first layer 602 to form the material bilayer 64. In embodiments comprising PEALD of silicon nitride, the second layer 606 may be a nitride layer.

According to various embodiments, the deposition process depicted in FIGS. 6A and 6B may be performed once or may be part of a single cycle of a cyclic deposition process. In some embodiments comprising cyclic deposition, frequencies of the source power pulses may be varied according to the same protocol in every cycle, as described above. In embodiments comprising cyclic PEALD, purge steps may follow each instance of the steps illustrated in FIGS. 6A/6B. FIG. 6C depicts the result of repeating the process steps of FIGS. 6A/6B three times, such that a material laminate 66 has been deposited over the substrate 102.

Figure 7:
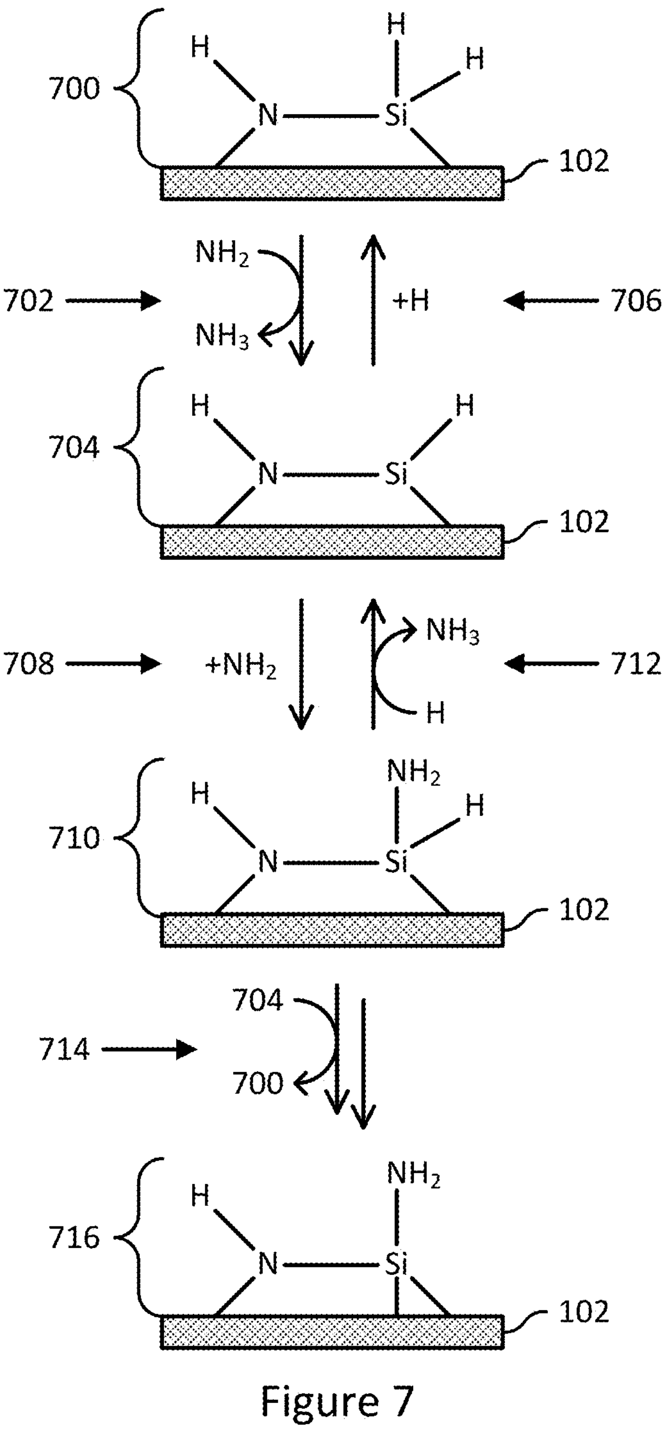
FIG. 7 illustrates a mechanism for nitridation of a silicon atom on the surface of a growing silicon nitride layer and highlights the role of neutral amino radicals and hydrogen atoms, in accordance with embodiments.

The advantages conferred by varying the pulse frequency during plasma-enhanced deposition may be illustrated most clearly with reference to a specific embodiment process, such as the plasma-enhanced nitridation step of PEALD of silicon nitride with a nitrogen precursor comprising ammonia ($NH_3$). According to such embodiments, FIG. 7 illustrates a mechanism for nitridation of a silicon atom on the surface of a growing silicon nitride layer during the process step depicted in FIG. 6B. This mechanism highlights the roles of two types of neutral species, amino radicals ($NH_2$) and hydrogen atoms (H), that may be formed from ammonia. In some embodiments, other hydrogen sources (such as $H_2$) may be present as well.

Initially, ammonia may adsorb to a silicon layer (such as the first layer 602, in some embodiments) and coordinate with a neighboring silicon atom, forming a silicon-ammonia adduct 700. When an amino radical from the plasma 126 approaches the surface of the substrate 102 and encounters the adduct 700, it can abstract a hydrogen atom, as indicated by reaction 702. The abstraction results in the formation of an ammonia molecule, which departs from the surface, leaving behind a first intermediate 704 comprising an open valence on the silicon atom.

The fate of the first intermediate 704 depends on which species from the plasma 126 it encounters next. If an H from the plasma 126 adds to the open valence in the first intermediate 704, reaction 706 results in the reformation of the silicon-ammonia adduct 700, such that there is no net progress toward nitridation. If instead the first intermediate 704 is encountered by another amino radical, the $NH_2$ can coordinate to the silicon atom (reaction 708) and form a second intermediate 710, advancing the nitridation process.

The second intermediate 710 may again follow either of two possible reaction pathways. H from the plasma 126 may react with the amino group on the silicon, forming ammonia that leaves the surface (reaction 712) and regenerates the first intermediate 704, reversing the progress made toward nitridation. Alternatively, the second intermediate 710 may undergo a bridging reaction with another instance of the first intermediate 704. Subsequent reactions and rearrangements (as indicated by the multi-reaction 714) result in the formation of a nitridated silicon product 716 and a new silicon-ammonia adduct 700.

The mechanism just described underscores the importance of the relative densities of neutral species (and their fluxes at the surface of the first layer 602 and the substrate 102). Amino radicals play a direct role, with amino-involved reactions 702 and 708 representing necessary steps toward nitridation. Amino radicals may also contribute to nitridation indirectly, by scavenging hydrogen atoms and facilitating the buildup of a sufficient surface concentration of the silicon-ammonia adduct 700 for the bridging reaction that begins the multi-reaction 714. Conversely, hydrogen atoms tend to impede the nitridation process by reverting intermediates to earlier species, as in reactions 706 and 712.

According to embodiments of this disclosure, pulse frequency changes during the plasma-enhanced nitridation process may enable advantageous control of the relative densities (and fluxes) of amino radicals and hydrogen atoms, effectively promoting the favorable, amino-involved reactions 702 and 708 while inhibiting the undesirable, hydrogen-involved reactions 706 and 712. Because inhibition of the latter steps may increase the effective rate constant for nitridation, control of the neutral densities and fluxes may advantageously increase throughput of substrates through plasma processing stages of fabrication.

Figure 8:
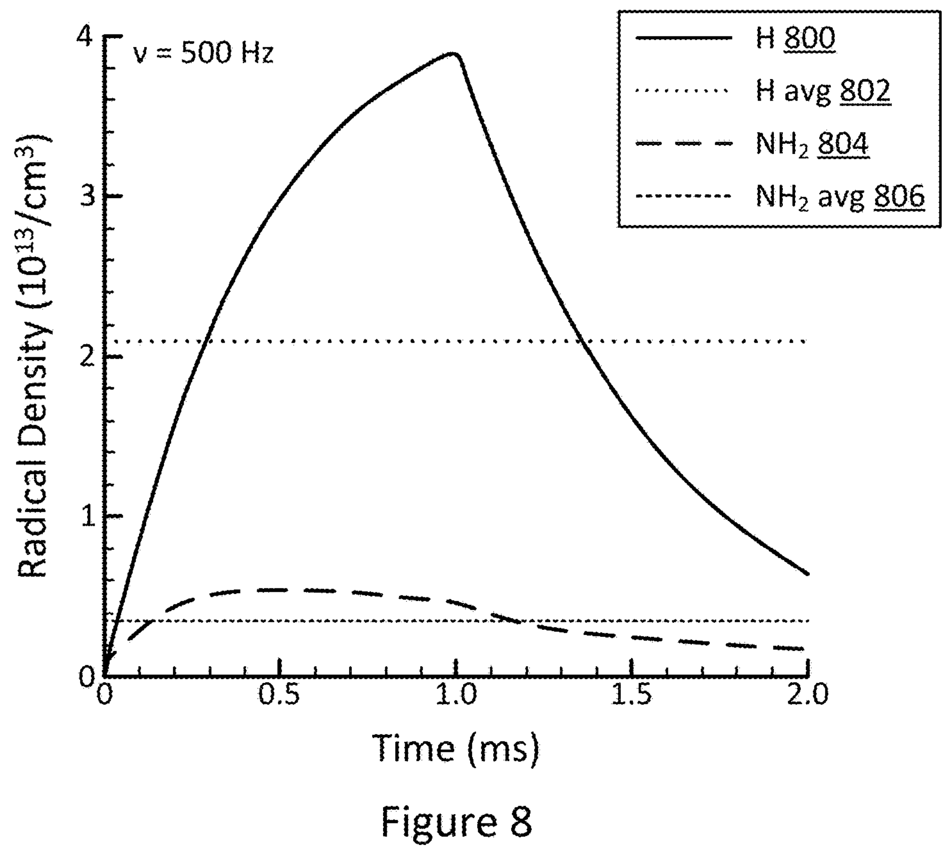
FIG. 8 plots densities of amino radicals and hydrogen atoms in a simulated plasma process with a pulse frequency of 500 Hz.

FIG. 8 presents a plot of densities of amino radicals and hydrogen atoms in a pulsed, inductively coupled plasma of ammonia and argon. The densities plotted were obtained from a computer simulation of a plasma generated at a total process pressure of 20 mtorr and a 1:4 ratio of ammonia pressure to argon pressure. The simulated source power pulses have a 50% duty cycle, an average wattage of 400 W, and a pulse frequency of 500 Hz approached from below by ramping from an initial frequency of 200 Hz. As such, the 2.0 ms interval depicted in FIG. 8 corresponds to a single representative pulse, with source power being switched off at 1.0 ms.

In FIG. 8, H density 800 rises quickly during the ON period (glow) to a peak just below $4\times10^{13}$ atoms/$cm^3$, then drops off more slowly during the OFF period (afterglow). The corresponding pulse period-averaged hydrogen density is indicated by half-dotted line 802. $NH_2$ density 804, by contrast, rises more slowly but plateaus early at a value around $5.5\times10^{12}$ radicals/$cm^3$, dropping off very gently during the OFF period. The corresponding pulse period-averaged amino density is given by half-half-dashed line 806.

Because the amino density 804 is near its peak value (modulating relatively slowly) for much of the pulse, and because the hydrogen density 800 changes substantially (modulating relatively quickly) during the same period, the relative density (and surface flux) of amino radicals is enhanced. This enhancement is especially pronounced at the beginning and end of the pulse, when the amino density 804 and the H density 800 are more nearly comparable.

As indicated in FIG. 8, the average amino density (half-half dashed line 806) is about $3.6\times10^{12}$ radicals/$cm^3$, while the average hydrogen density (half-dotted line 802) is about $2.12\times10^{13}$ atoms/$cm^3$, yielding a ratio of about 0.17 radicals/atom, or 1 amino radical for every 6 hydrogens (~1 $NH_2$:6 H).

By contrast, simulations of a continuous-wave plasma with all other process parameters unchanged yields an average ratio of 0.15 radicals/atom (~1 $NH_2$: 7 H). Continuous-wave experiments analyzed by differentially pumped multistage mass spectrometry show that even more hydrogen is produced in practice, with an average ratio of 0.10 radicals/atom (~1 $NH_2$: 10 H). In other words, pulsing the source power may increase the relative density of amino radicals substantially, effectively promoting amino-involved reactions and inhibiting those involving hydrogen.

Figure 9:
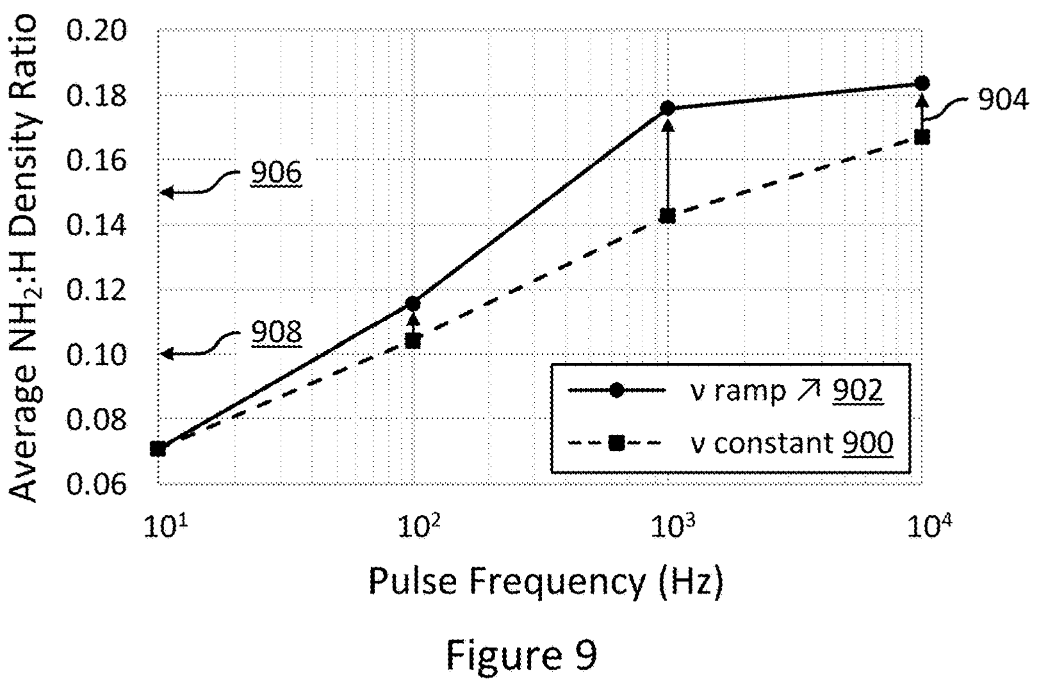
FIG. 9 illustrates a pulse period-averaged amino radical: hydrogen atom density ratio in a simulated plasma process as a function of pulse frequency and further provides a comparison between results obtained with constant pulsing and with a continuously ramped pulse frequency.

FIG. 9 is a linear-log plot of the frequency dependence of the pulse period-averaged amino:hydrogen density ratio, as obtained from simulations of plasma conditions similar to those described above. Dashed line 900 represents results from simulations with a constant pulse frequency, showing a logarithmic enhancement in the pulse period-averaged amino:hydrogen ratio as the pulse frequency is increased. Changing the pulse frequency with a continuous, monotonic ramp yields a more pronounced logarithmic enhancement, as indicated by the simulation results (solid line 902) and difference arrows 904.

The two lines 900 and 902 may be contrasted with the values obtained from continuous-wave simulations (upper arrow 906, indicating a ratio of ~0.15) and from continuous-wave experiments (lower arrow 908, indicating a ratio of ~0.10). Irrespective of whether the pulse frequency is held constant or ramped, a target value of the frequency may be identified and selected such that the average ratio of amino radicals to hydrogen atoms is more favorable for deposition than with continuous-wave power.

Without committing to any definite mechanism, an explanation for this behavior may be as follows: At very low pulse frequencies, the pulse period becomes longer and longer, such that each pulse effectively comprises a lengthy period of continuous-wave plasma generation separated by an equally long period of electron recombination and plasma quenching, yielding an average density ratio lower than would be achieved by continuous-wave power over the entire period. For example, a pulse frequency of 0.01 Hz would correspond to a pulse period of 100 s, such that each ON period would last 50 s and be followed by 50 s of plasma quenching. At very high pulse frequencies, by contrast, the OFF time may become so short that the source power is effectively supplied continuously. FIG. 9 indicates that pulse frequencies above about 100 Hz are in an intermediate regime, where modulation of density and flux transients may be significant and advantageous.

Figure 10:
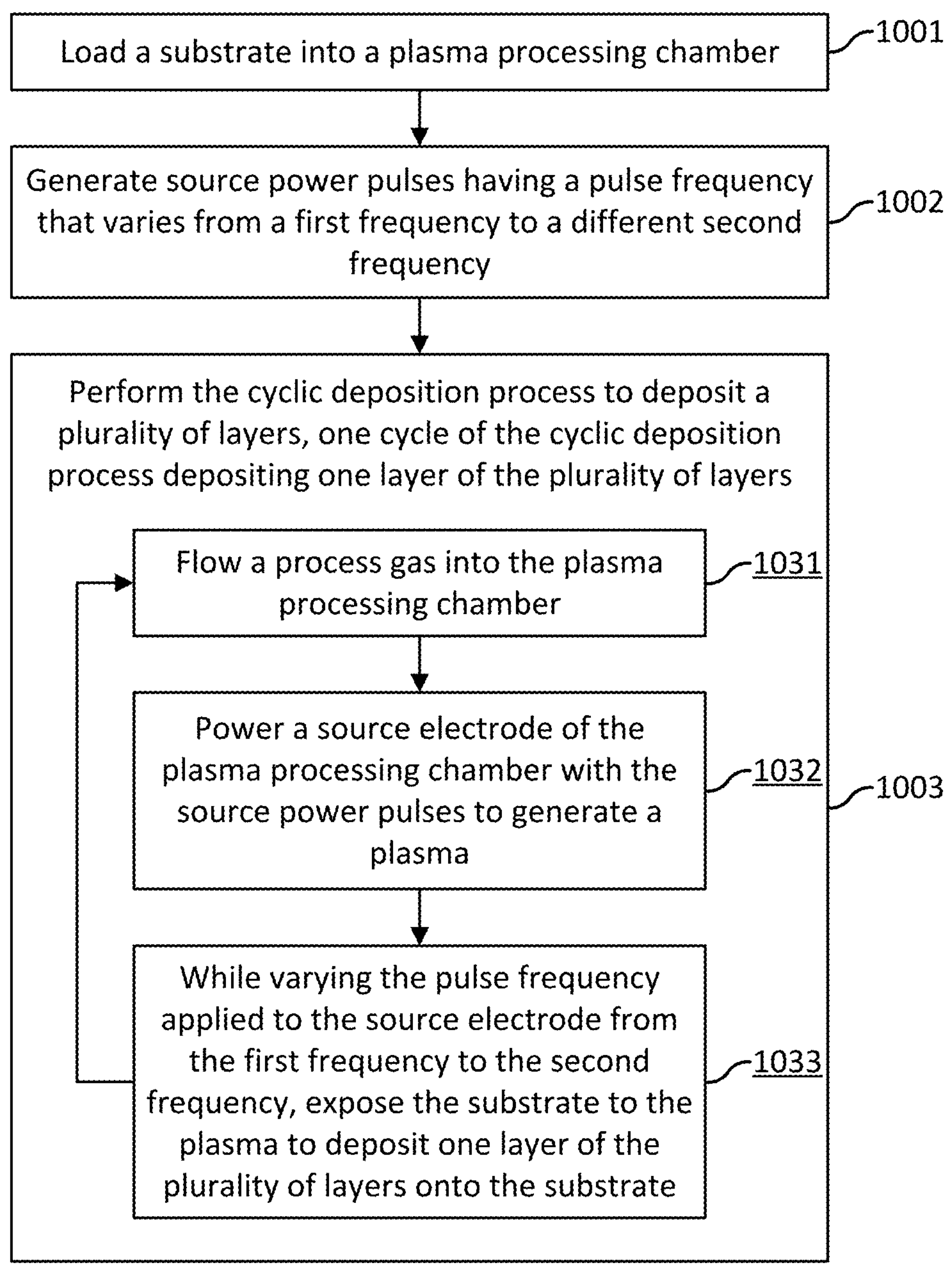
FIG. 10 provides a flow chart for a method for a cyclic deposition process, and in particular for performing a cyclic deposition process in a plasma processing chamber while varying a pulse frequency within each deposition cycle from a first frequency to a second frequency, in accordance with various embodiments.

The process flows described with reference to FIG. 1 and FIGS. 5A-5C or FIGS. 6A-6C may represent various embodiments of more general methods, as illustrated in the first instance by a flow chart in FIG. 10.

In box 1001, a substrate is loaded into a plasma processing chamber. Next, in box 1002, source power pulses are generated, the source power pulses having a pulse frequency that varies from a first frequency to a different second frequency. Then, in box 1003, a cyclic deposition process is performed to deposit a plurality of layers, one cycle of the cyclic deposition process depositing one layer of the plurality of layers, as illustrated by sub-boxes 1031-1033.

In sub-box 1031, a process gas is flowed into the plasma processing chamber. Next, in sub-box 1032, a source electrode of the plasma processing chamber is powered with the source power pulses to generate a plasma. Then, in sub-box 1033, while the pulse frequency applied to the source electrode is varied from the first frequency to the second frequency, the substrate is exposed to the plasma to deposit one layer of the plurality of layers onto the substrate. Sub-boxes 1031-1033 may be repeated as many times as may be desirable for depositing a target number of layers or a target thickness of deposited material.

Figure 11:
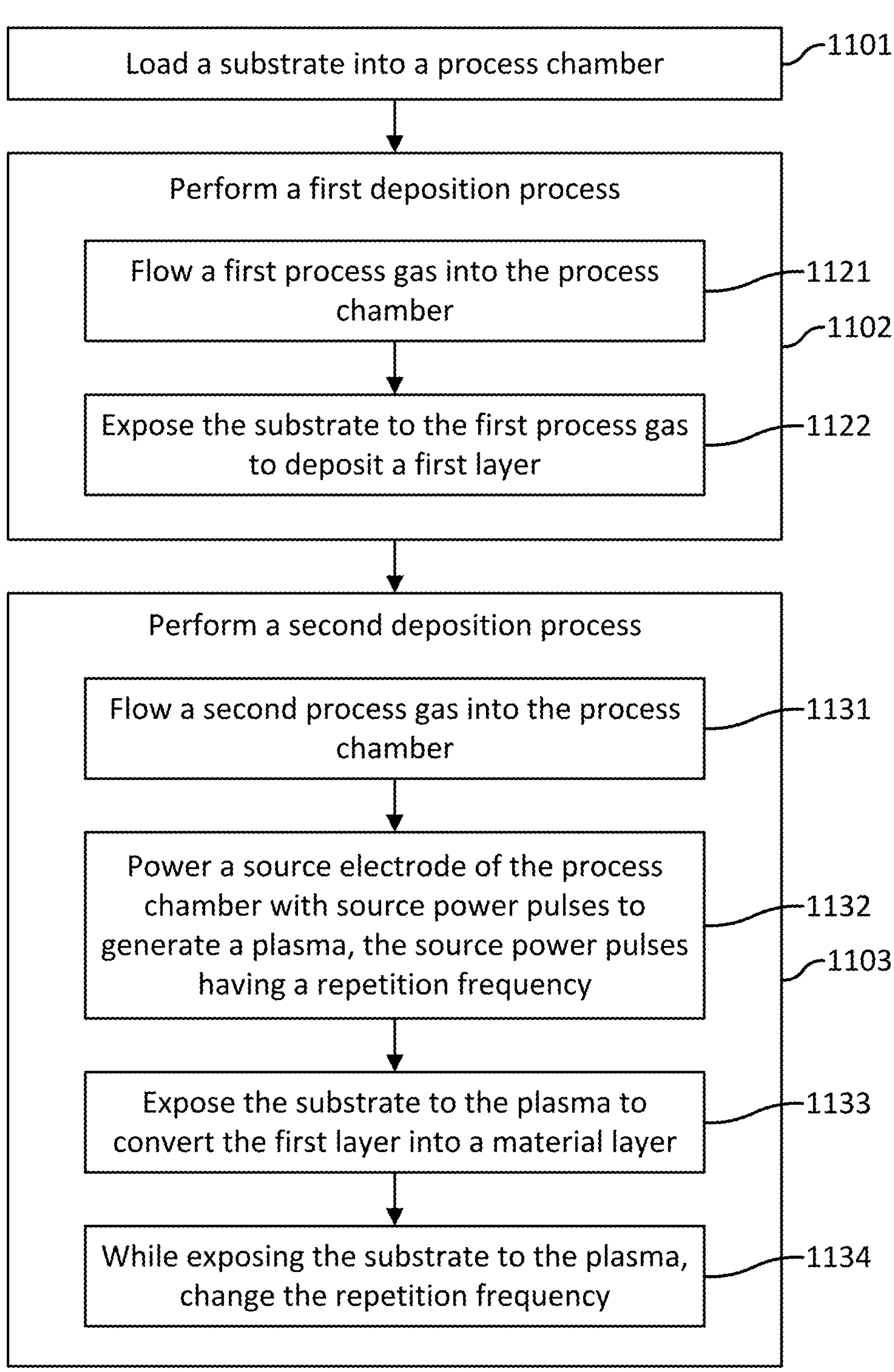
FIG. 11 provides a flow chart for a method for processing a substrate, and in particular for performing a first deposition process followed by a second deposition process comprising exposing the substrate to a plasma generated by source power pulses with a pulse frequency that changes, in accordance with various embodiments.

FIG. 11 provides a flow chart for another general deposition method with various embodiments represented by FIG. 1 and either FIGS. 5A-5C or FIGS. 6A-6C. In box 1101, a substrate is loaded into a process chamber.

Next, in box 1102, a first deposition process is performed, as illustrated by sub-boxes 1121 and 1122. In sub-box 1121, a first process gas is flowed into the process chamber. In sub-box 1122, the substrate is exposed to the first process gas to deposit a first layer.

Then, in box 1103, a second deposition process is performed, as illustrated by sub-boxes 1131-1134. In sub-box 1131, a second process gas is flowed into the process chamber. Next, in sub-box 1132, a source electrode of the process chamber is powered with source power pulses to generate a plasma. The source power pulses have a repetition frequency, which may be the pulse frequency described above.

Continuing in sub-box 1133, the substrate is exposed to the plasma to convert the first layer into a material layer. Then, in sub-box 1134, while the substrate is exposed to the plasma, the repetition frequency is changed.

Neither the first deposition process of box 1102 nor the second deposition process of box 1103 need be cyclic. At the same time, either deposition process (or both) may be cyclic as appropriate to achieve deposition of a specific material or a target thickness of that material.

Figure 12:
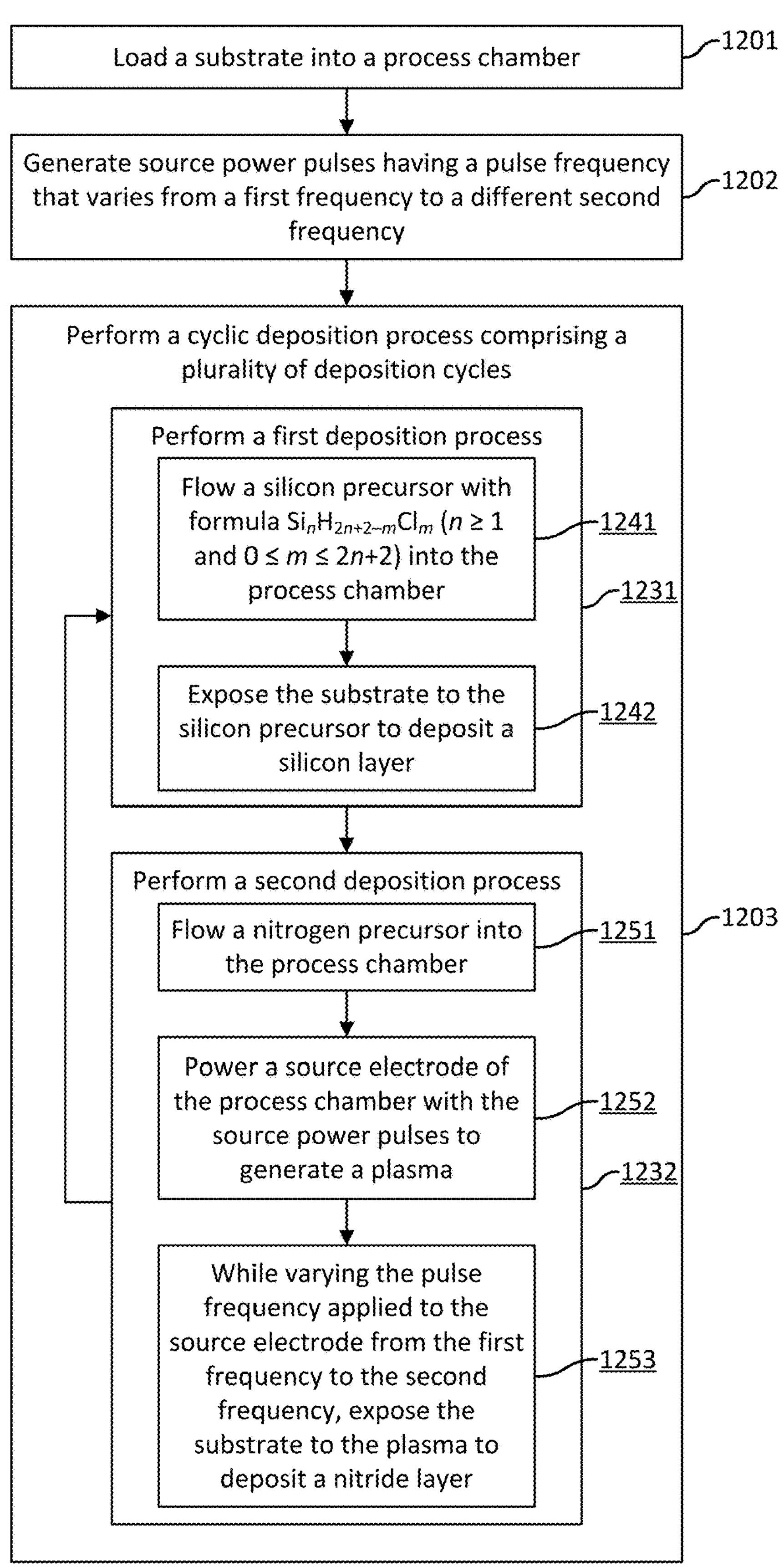
FIG. 12 provides a flow chart for a method for processing a substrate, and in particular for performing a cyclic process depositing silicon nitride while varying a pulse frequency within each deposition cycle from a first frequency to a second frequency, in accordance with various embodiments.

FIG. 12 provides a flow chart for still another general deposition method with various embodiments represented by FIG. 1 and either FIGS. 5A-5C or FIGS. 6A-6C. In box 1201, a substrate is loaded into a process chamber. Next, in box 1202, source power pulses are generated, the source power pulses having a pulse frequency that varies from a first frequency to a different second frequency. Then, in box 1203, a cyclic deposition process is performed, the cyclic deposition process comprising a plurality of deposition cycles, as illustrated by sub-boxes 1231 and 1232.

In sub-box 1231, a first deposition process is performed, as illustrated by inner boxes 1241 and 1242. In inner box 1241, a silicon precursor with formula $Si_nH_{2n+2-m}Cl_m$ ($n\geq1$ and $0\leq m\leq 2n+2$) is flowed into the process chamber. Then, in inner box 1242, the substrate is exposed to the silicon precursor to deposit a silicon layer.

In sub-box 1232, a second deposition process is performed, as illustrated by inner boxes 1251-1253. In inner box 1251, a nitrogen precursor is flowed into the process chamber. Next, in inner box 1252, a source electrode of the process chamber is powered with the source power pulses to generate a plasma. Then, in inner box 1253, while the pulse frequency applied to the source electrode is varied from the first frequency to the second frequency, the substrate is exposed to the plasma to deposit a nitride layer.

The first deposition process of sub-box 1231 and the second deposition process of sub-box 1232 may be repeated as many times as may be desirable for depositing a target thickness of silicon nitride.

Example embodiments of the invention are described below. Other embodiments can also be understood from the entirety of the specification as well as the claims filed herein.

Example 1. A method for a cyclic deposition process includes loading a substrate into a plasma processing chamber; generating source power pulses having a pulse frequency that varies from a first frequency to a different second frequency; and performing the cyclic deposition process to deposit a plurality of layers. One cycle of the cyclic deposition process deposits one layer of the plurality of layers and includes flowing a process gas into the plasma processing chamber; powering a source electrode of the plasma processing chamber with the source power pulses to generate a plasma; and, while varying the pulse frequency applied to the source electrode from the first frequency to the second frequency, exposing the substrate to the plasma to deposit one layer of the plurality of layers onto the substrate.

Example 2. The method of example 1, where varying the pulse frequency includes changing from the first frequency to the second frequency, the second frequency being higher than the first frequency.

Example 3. The method of one of examples 1 or 2, where the first frequency is between 1 Hz and 10 Hz and the second frequency is between 10 kHz and 10 MHz.

Example 4. The method of one of examples 1 to 3, where varying the pulse frequency includes changing from the first frequency to the second frequency, the second frequency being lower than the first frequency.

Example 5. The method of one of examples 1 to 4, where the first frequency is between 10 kHz and 10 MHz and the second frequency is between 1 Hz and 10 Hz.

Example 6. The method of one of examples 1 to 5, where varying the pulse frequency includes a monotonic ramping.

Example 7. The method of one of examples 1 to 6, where varying the pulse frequency includes a continuous ramping.

Example 8. The method of one of examples 1 to 7, where varying the pulse frequency includes a ramping that occurs over a time period between 10 us and 1 s.

Example 9. The method of one of examples 1 to 8, where the cyclic deposition process is part of a plasma-enhanced deposition process.

Example 10. A method for processing a substrate includes loading a substrate into a process chamber; performing a first deposition process that includes flowing a first process gas into the process chamber and exposing the substrate to the first process gas to deposit a first layer; performing a second deposition process that includes flowing a second process gas into the process chamber, powering a source electrode of the process chamber with source power pulses to generate a plasma, the source power pulses having a repetition frequency, and exposing the substrate to the plasma to convert the first layer into a material layer; and, while exposing the substrate to the plasma, changing the repetition frequency.

Example 11. The method of example 10, further including: repeatedly alternating the performing of the first deposition process and the performing of the second deposition process; and between the performing of the first deposition process and the performing of the second deposition process, performing a purge step to remove residual portions of the first process gas, the second process gas, or both.

Example 12. The method of one of examples 10 or 11, where changing the repetition frequency includes continuously and monotonically increasing the repetition frequency.

Example 13. The method of one of examples 10 to 12, where changing the repetition frequency includes continuously and monotonically decreasing the repetition frequency.

Example 14. The method of one of examples 10 to 13, where changing the repetition frequency includes a linear, geometric, or hyperbolic frequency chirp.

Example 15. The method of one of examples 10 to 14, where the repetition frequency is between 10 kHz and 10 MHz after being changed.

Example 16. The method of one of examples 10 to 15, where changing the repetition frequency includes altering a flux ratio of neutral species within the process chamber.

Example 17. A method for processing a substrate includes loading a substrate into a process chamber; generating source power pulses having a pulse frequency that varies from a first frequency to a different second frequency; performing a cyclic deposition process that includes a plurality of deposition cycles, one of the deposition cycles including: performing a first deposition process that includes flowing a silicon precursor with formula $Si_nH_{2n+2-m}Cl_m$ ($n \geq 1$ and $0 \leq m \leq 2n+2$) into the process chamber and exposing the substrate to the silicon precursor to deposit a silicon layer; and performing a second deposition process that includes flowing a nitrogen precursor into the process chamber, powering a source electrode of the process chamber with the source power pulses to generate a plasma, and, while varying the pulse frequency applied to the source electrode from the first frequency to the second frequency, exposing the substrate to the plasma to deposit a nitride layer.

Example 18. The method of example 17, where the silicon precursor is silane, dichlorosilane, or hexachlorodisilane.

Example 19. The method of one of examples 17 or 18, further including flowing a noble gas into the process chamber simultaneously with the nitrogen precursor, where the nitrogen precursor includes elemental nitrogen ($N_2$), ammonia, or hydrazine.

Example 20. The method of one of examples 17 to 19, where the noble gas is argon, where the nitrogen precursor is ammonia, and where a ratio of a flow rate of ammonia to a flow rate of argon into the process chamber is between 1:100 and 4:1.

Example 21. The method of one of examples 17 to 20, further including flowing elemental hydrogen ($H_2$) into the process chamber simultaneously with the nitrogen precursor.

Example 22. The method of one of examples 17 to 21, where the deposition cycles further include performing a purge step after the first deposition process, after the second deposition process, or both.

Example 23. The method of one of examples 17 to 22, where varying the pulse frequency includes continuously and monotonically ramping the pulse frequency from the first frequency to the second frequency.

Example 24. The method of one of examples 17 to 23, where the first frequency is between 1 Hz and 10 Hz and the second frequency is between 10 kHz and 10 MHz.

Example 25. The method of one of examples 17 to 24, where varying the pulse frequency includes changing a ratio of a flux of amino radicals and a flux of hydrogen atoms in the plasma.

While this invention has been described with reference to illustrative embodiments, this description is not intended to be construed in a limiting sense. Various modifications and combinations of the illustrative embodiments, e.g., of FIGS. 1-6 and FIGS. 10-12, as well as other embodiments of the invention, will be apparent to persons skilled in the art upon reference to the description. It is therefore intended that the appended claims encompass any such modifications or embodiments.

What is claimed is:

1. A method for a cyclic deposition process, the method comprising:

loading a substrate into a plasma processing chamber;

generating source power pulses having a pulse frequency that varies continuously and monotonically from a first frequency to a different second frequency; and performing the cyclic deposition process to deposit a plurality of layers, one cycle of the cyclic deposition process depositing one layer of the plurality of layers and comprising:

flowing a process gas into the plasma processing chamber;

powering a source electrode of the plasma processing chamber with the source power pulses to generate a plasma; and while varying the pulse frequency applied to the source electrode continuously and monotonically from the first frequency to the second frequency, exposing the substrate to the plasma to deposit one layer of the plurality of layers onto the substrate.

2. The method of claim 1, wherein the second frequency is higher than the first frequency.

3. The method of claim 2, wherein the first frequency is between 1 Hz and 10 Hz and the second frequency is between 10 kHz and 10 MHz.

4. The method of claim 1, wherein the second frequency is lower than the first frequency.

5. The method of claim 1, wherein varying the pulse frequency comprises a ramping that occurs over a time period between 10 μs and 1 s.

6. A method for processing a substrate, the method comprising:

loading a substrate into a process chamber;

performing a first deposition process, the first deposition process comprising:

flowing a first process gas into the process chamber; and exposing the substrate to the first process gas to deposit a first layer;

performing a second deposition process, the second deposition process comprising:

flowing a second process gas into the process chamber;

powering a source electrode of the process chamber with source power pulses to generate a plasma, the source power pulses having a repetition frequency;

exposing the substrate to the plasma to convert the first layer into a material layer; and while exposing the substrate to the plasma, changing the repetition frequency continuously and monotonically.

7. The method of claim 6, further comprising:

repeatedly alternating the performing of the first deposition process and the performing of the second deposition process; and between the performing of the first deposition process and the performing of the second deposition process, performing a purge step to remove residual portions of the first process gas, the second process gas, or both.

8. The method of claim 6, wherein changing the repetition frequency comprises increasing the repetition frequency.

9. The method of claim 6, wherein changing the repetition frequency comprises a linear, geometric, or hyperbolic frequency chirp.

10. The method of claim 6, wherein the repetition frequency is between 10 kHz and 10 MHz after being changed.

11. The method of claim 6, wherein changing the repetition frequency comprises altering a flux ratio of neutral species within the process chamber.

12. A method for processing a substrate, the method comprising:

loading a substrate into a process chamber;

generating source power pulses having a pulse frequency that varies continuously and monotonically from a first frequency to a different second frequency;

performing a cyclic deposition process comprising a plurality of deposition cycles, one of the deposition cycles comprising:

performing a first deposition process, the first deposition process comprising:

flowing a silicon precursor with formula $Si_nH_{2n+2-m}Cl_m$ ($n \geq 1$ and $0 \leq m \leq 2n+2$) into the process chamber; and exposing the substrate to the silicon precursor to deposit a silicon layer; and performing a second deposition process, the second deposition process comprising:

flowing a nitrogen precursor into the process chamber;

powering a source electrode of the process chamber with the source power pulses to generate a plasma; and while varying the pulse frequency applied to the source electrode continuously and monotonically from the first frequency to the second frequency, exposing the substrate to the plasma to deposit a nitride layer.

13. The method of claim 12, wherein the silicon precursor is silane, dichlorosilane, or hexachlorodisilane.

14. The method of claim 12, further comprising flowing a noble gas into the process chamber simultaneously with the nitrogen precursor, wherein the nitrogen precursor comprises elemental nitrogen ($N_2$), ammonia, or hydrazine.

15. The method of claim 14, wherein the noble gas is argon, wherein the nitrogen precursor is ammonia, and wherein a ratio of a flow rate of ammonia to a flow rate of argon into the process chamber is between 1:100 and 4:1.

16. The method of claim 12, wherein varying the pulse frequency comprises a ramping that occurs over a time period between 10 μs and 1 s.

17. The method of claim 12, wherein the first frequency is between 1 Hz and 10 Hz and the second frequency is between 10 kHz and 10 MHz.

18. The method of claim 12, wherein varying the pulse frequency comprises changing a ratio of a flux of amino radicals and a flux of hydrogen atoms in the plasma.

19. The method of claim 1, wherein varying the pulse frequency continuously and monotonically comprises a linear, geometric, or hyperbolic frequency chirp.

20. The method of claim 12, wherein varying the pulse frequency continuously and monotonically comprises a linear, geometric, or hyperbolic frequency chirp.

* * * * *